(12) United States Patent
Miyazaki et al.

(10) Patent No.: US 12,094,754 B2
(45) Date of Patent: Sep. 17, 2024

(54) SUBSTRATE SUPPORTING APPARATUS AND METHOD OF CONTROLLING SUBSTRATE SUPPORTING APPARATUS

(71) Applicant: EBARA CORPORATION, Tokyo (JP)

(72) Inventors: Mitsuru Miyazaki, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 796 days.

(21) Appl. No.: 16/823,448

(22) Filed: Mar. 19, 2020

(65) Prior Publication Data

US 2020/0321237 A1 Oct. 8, 2020

(30) Foreign Application Priority Data

Apr. 2, 2019 (JP) ................. 2019-070492

(51) Int. Cl.
*H01L 21/687* (2006.01)
*H02K 11/24* (2016.01)

(52) U.S. Cl.
CPC .. *H01L 21/68764* (2013.01); *H01L 21/68728* (2013.01); *H02K 11/24* (2016.01)

(58) Field of Classification Search
CPC ............. H01L 21/68728; H01L 21/68764
See application file for complete search history.

(56) References Cited

U.S. PATENT DOCUMENTS

| 6,129,100 A | 10/2000 | Kitagawa et al. |
| 2005/0237529 A1 | 10/2005 | Kanno et al. |
| 2007/0226992 A1 | 10/2007 | Kaneko et al. |
| 2014/0116478 A1* | 5/2014 | Higashijima ..... H01L 21/67051 134/104.2 |
| 2018/0337072 A1 | 11/2018 | Nakano et al. |

FOREIGN PATENT DOCUMENTS

| JP | 2000-068243 A | 3/2000 |
| JP | 2002-373610 A | 12/2002 |
| JP | 2004-079587 A | 3/2004 |
| JP | 2005-019456 A | 1/2005 |
| JP | 2006-222190 A | 8/2006 |
| JP | 2007-294920 A | 11/2007 |
| JP | 2008-060402 A | 3/2008 |
| JP | 2010-074108 A | 4/2010 |
| JP | 2018-195680 A | 12/2018 |

OTHER PUBLICATIONS

JP2010074108—Machine Translation (Year: 2010).*
JP2006222190—Machine Translation (Year: 2006).*

* cited by examiner

*Primary Examiner* — Marc Lorenzi
(74) *Attorney, Agent, or Firm* — PEARNE & GORDON LLP

(57) ABSTRACT

Exemplary substrate supporting apparatus and method for attaching and/or detaching substrate are provided. In one aspect, substrate supporting apparatus has a plurality of supporting members 10 that contacts a circumferential part of a substrate W and rotate the substrate W; a pair of driven members 30 on which the plurality of supporting members 10 are provided; a connecting member 20 connecting one driven member 31 and another driven member 32; and a driving device 40 that brings the pair of driven members 30 close to each other or separates the pair of driven members 30 from each other, linearly along a first direction, by moving at least a part of the connecting member 20. Numerous other aspects are provided.

5 Claims, 10 Drawing Sheets

SUBSTRATE SUPPORTING APPARATUS AND METHOD OF CONTROLLING SUBSTRATE SUPPORTING APPARATUS

BACKGROUND

Technical Field

The present invention relates to a substrate supporting apparatus for supporting a substrate in such a manner that the substrate can rotate, and to a method of controlling the substrate supporting apparatus.

The present application claims the priority of Japanese Patent Application No. 2019-070492 filed on Apr. 2, 2019, the contents of which are entirely incorporated by reference.

Relate Art

Conventionally, there has been known a spin chuck or the like that supports a substrate such as a wafer. JP 2005-19456 A discloses a spin chuck having a rotation axis and a plurality of pinching units that can pinch a wafer and cancel the pinch. According to the conventional art, in an aspect in which four supporting members are provided, two supporting members on one side are fixed so as not to move in an in-plane direction of a substrate, thereby forming a fixed-side clamping mechanism, whereas the other two supporting members on the other side are movable in an in-plane direction of the substrate, thereby forming a driving-side clamping mechanism.

A supporting member formed of a spindle or the like wears out from use. For example, in a case where a wafer being one example of a substrate is used, a supporting member wears out due to contact with an edge of the wafer. As the supporting member wears out in this manner, the wafer moves a distance corresponding to the wear-out, toward the fixed-side clamping mechanism when supported (held) by the supporting member. Thus, a substrate supporting position is displaced due to wear-out of the supporting member, which causes a problem of displacement of a substrate cleaning position.

Meanwhile, it is common to adjust a pressure (clamping pressure) for supporting a substrate by using a load-cell jig at the time of shipment of a substrate supporting apparatus or at the time of delivery to a customer. However, as described above, as a supporting member wears out, a pressure actually applied to the substrate deviates from an initially-adjusted pressure. A pressure may be adjusted regularly by using a load-cell jig. Nonetheless, repeated use causes deviation of a pressure, so that the substrate may become supported under a pressure different from allowable pressures before pressure adjustment and then be subjected to processes such as cleaning, in some instances.

SUMMARY

The present invention provides a substrate supporting apparatus and so on that can keep supporting a substrate in the same state as its initial state in spite of wear-out of a supporting member.

[Concept 1]

A substrate supporting apparatus may comprise:

a plurality of supporting members adapted to contact a circumferential part of a substrate and rotate the substrate;

a pair of driven members on which the plurality of supporting members are provided;

a connecting member which is movably coupled to one driven member and which is movably coupled to another driven member; and a driving device adapted to transmit a force for the connecting member to move linearly along a second direction, wherein the connecting member may be adapted to convert the linear force along the second direction to a force to increase or decrease the distance between the pair of driven members.

[Concept 2]

The substrate supporting apparatus, according to concept 1, may further comprise:

a first guided member, which is provided on the one driven member, for linearly moving the one driven member along the first direction;

a second guided member, which is provided on the other driven member, for linearly moving the other driven member along the first direction;

a first guide for guiding the first guided member along the first direction; and a second guide for guiding the second guided member along the first direction.

[Concept 3]

The substrate supporting apparatus, according to concept 2, may further comprise:

a base on which the first guide and the second guide are provided, wherein a long hole, through which the supporting members pass, extending along the first direction is provided in the base.

[Concept 4]

In the substrate supporting apparatus according to any one of concepts 1 to 3, a plurality of supporting members and a plurality of first guided members for linearly moving the one driven member along the first direction may be provided on the one driven member, a plurality of supporting members and a plurality of second guided members for linearly moving the other driven member along the first direction may be provided on the other driven member, the plurality of first guided members may be provided between the supporting members provided on the one driven member, and the plurality of second guided members may be provided between the supporting members provided on the other driven member.

[Concept 5]

In the substrate supporting apparatus according to any one of concepts 1 to 4, the connecting member may have a base end movable along a second direction that is an in-plane direction of the substrate and is perpendicular to the first direction, and a pair of arms may be opened or closed by moving the base end along the second direction.

[Concept 6]

The substrate supporting apparatus, according to any one of concepts 1 to 5, may further comprise:

a first detection device that detects a force applied to the connecting device by the driving device or a force applied to the driven device via the connecting device by the driving device; and a control device configured to control the driving device in such a manner that the force detected by the first detection device has a value in a first range.

[Concept 7]

In the substrate supporting apparatus according to any one of concepts 1 to 6, the connecting member may have a pair of arms that can be opened and closed, a plurality of supporting members may be provided on the one driven member, and each of supporting members provided on the one driven member is swingable relative to one arm in an in-plane direction of the substrate, and a plurality of supporting members may be provided on the other driven member, and each of supporting members provided on the other driven member is swingable relative to another arm in an in-plane direction of the substrate.

[Concept 8]

In the substrate supporting apparatus according to any one of concepts 1 to 7, the driving device may be a motor, the substrate supporting apparatus may further comprise:

a second detection device that detects torque of the motor; and a control device configured to control the motor in such a manner that the torque detected by the second detection device has a value in a second range.

[Concept 9]

A substrate processing apparatus may comprise a substrate supporting apparatus according to any one of concepts 1 to 8.

[Concept 10]

In the substrate supporting apparatus according to any one of concepts 1 to 8, a part of the connecting member may be extending in a second direction, and the connecting member may have a pair of arms and a hub connecting the pair of arms, a first direction and the second direction may be orthogonally crossed with each other, the hub may be moved along the second direction to increase or decrease the distance between the pair of driven members.

[Concept 11]

A method of controlling the substrate supporting apparatus, according to any one of concepts 1 to 8, may comprise steps of:

increasing the distance between driven members by moving at least a part of the connecting member linearly along the first direction;

providing the substrate between the plurality of supporting members;

decreasing the distance between the pair of driven members by moving at least the part of the connecting member linearly along the first direction, so that a circumferential part of the substrate is supported by the supporting members; and rotating the substrate by rotating the supporting members.

In a case of adopting an aspect in which the connecting member connecting the one driven member and the other driven member is provided and the driving device brings the pair of driven members close to each other or separates the pair of driven members 30 from each other, linearly along the first direction, by moving the connecting member, the one driven member and the other driven member can be moved at the same timing. Thus, a position where the substrate is supported by the supporting members (clamping position) can become unlikely to be displaced. Further, even in a case where a supporting member having worn out to a degree equal to or higher than a previously-estimated degree that would require replacement in the conventional art is continuously used, displacement of a substrate supporting position can be reduced, thereby making a usable life of the supporting member longer than that in the conventional art.

DETAILED DESCRIPTION

First Embodiment

<<Configuration>>

A substrate processing apparatus including a substrate cleaning apparatus and so on according to a first embodiment will be described.

Figure 8:
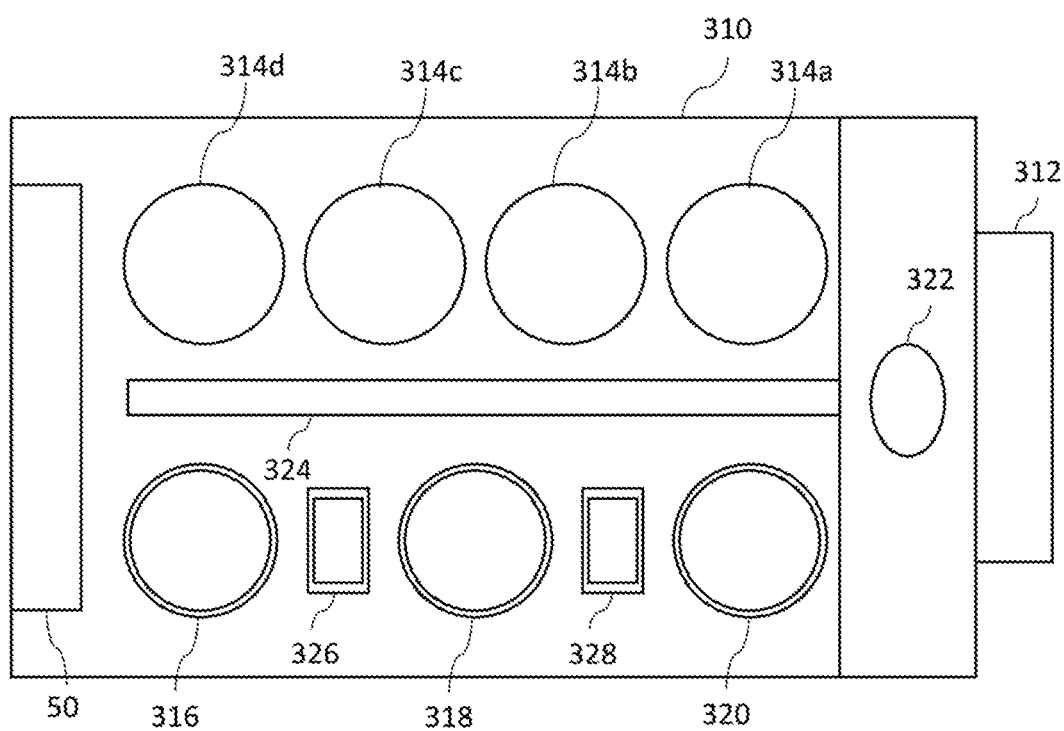
FIG. 8 is a schematic plan view showing an overall configuration of the substrate processing apparatus including a substrate cleaning apparatus according to the first embodiment of the present invention.

As shown in FIG. 8, the substrate processing apparatus, according to the present embodiment, has a roughly rectangular housing 310 and a load port 312; a substrate cassette that stocks a number of substrates W is put on the load port 312. The load port 312 is placed adjacent to the housing 310. The load port 312 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 310, a plurality of (in an aspect shown in FIG. 8, four) polishing units 314a to 314d, first and second cleaning units 316 and 318 for cleaning a polished substrate W, and a drying unit 320 for drying the cleaned substrate W is contained. The polishing units 314a to 314d are arranged along a long side of the substrate processing apparatus, and the cleaning units 316 and 318 and the drying unit 320 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to other embodiment may be configured to clean and dry a substrate W without a polishing unit for polishing the substrate W inside the housing 310.

In an area surrounded by the load port 312, and the polishing unit 314a and the drying unit 320 that are located on the side of the load port 312, a first conveyance robot 322 is placed. Furthermore, a conveyance unit 324 is placed parallel to the polishing units 314a to 314d as well as the cleaning units 316 and 318 and the drying unit 320. The first conveyance robot 322 receives a pre-polished substrate W from the load port 312 and transfers the substrate W to the conveyance unit 324, or receives a dried substrate W from the drying unit 320.

A second conveyance robot 326 for transferring a substrate W between the first cleaning unit 316 and the second cleaning unit 318 is placed between the first cleaning unit 316 and the second cleaning unit 318, and a third conveyance unit 328 for transferring the substrate W between the second cleaning unit 318 and the drying unit 320 is placed between the second cleaning unit 318 and the drying unit 320. Furthermore, inside the housing 310, an control device 50 for controlling the operation of each device of the substrate processing apparatus is placed. In the present embodiment, there is described the aspect in which the control device 50 is placed inside the housing 310; however, the placement of the control device 50 is not limited to this, and the control device 50 may be placed outside the housing 310, and the control device 50 may be provided at a remote place. When the control device 50 is provided at the remote place, each device in the substrate processing apparatus is remotely controlled by the control device 50.

A roll cleaning apparatus for scrubbing a surface of a substrate W while rotating around the center axis parallel with the substrate W by bringing the roll cleaning members linearly extending almost along the full diameter of the substrate W into contact with a cleaning liquid may be used for the first cleaning unit 316. For example, the roll cleaning members may be brought into contact with a substrate W to clean the substrate W while the substrate W is horizontally or vertically held or held in an inclined direction against horizontal direction, and the substrate W is being rotated. A pencil cleaning apparatus for scrubbing a surface of a substrate W by bringing the contact faces of the vertically-extending columnar pencil cleaning members into contact with a cleaning liquid and moving the pencil cleaning members in one direction while rotating may be used for the second cleaning unit 318. A spin drying unit for drying a substrate W by injecting IPA steam from a moving injection nozzle toward the horizontally-held and rotating substrate W and drying the substrate W by centrifugal force by faster rotating the substrate W may be used for the drying unit 320.

The first cleaning unit 316 may use not a roll cleaning apparatus, but a pencil cleaning apparatus similar to the second cleaning unit 318 or a two-fluid jet cleaning apparatus for cleaning a surface of a substrate W by two-fluid jet. Further, the second cleaning unit 318 may use not a pencil cleaning apparatus, but a roll cleaning apparatus similar to the first cleaning unit 316, or a two-fluid jet cleaning apparatus for cleaning a surface of a substrate W by two-fluid jet.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. In the present embodiment, unless otherwise specified, cleaning liquid means either rinse liquid, chemical liquid or the both rinse liquid and chemical liquid.

Figure 2:
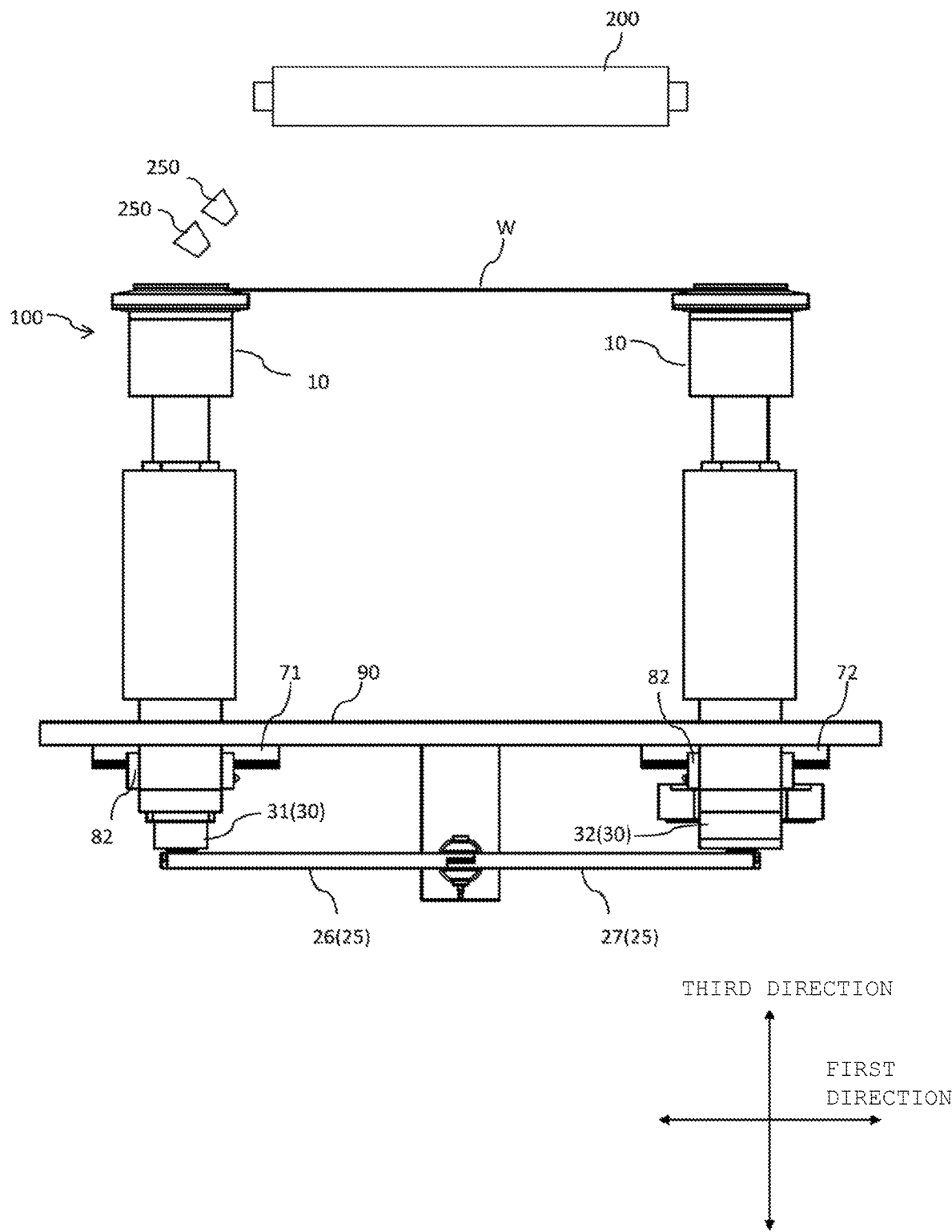
FIG. 2 is a side view of the substrate supporting apparatus that can be used in the first embodiment of the present invention, when seen from a second direction, and diagrammatically shows a cleaning member and a cleaning-liquid supplying unit.
Figure 3:
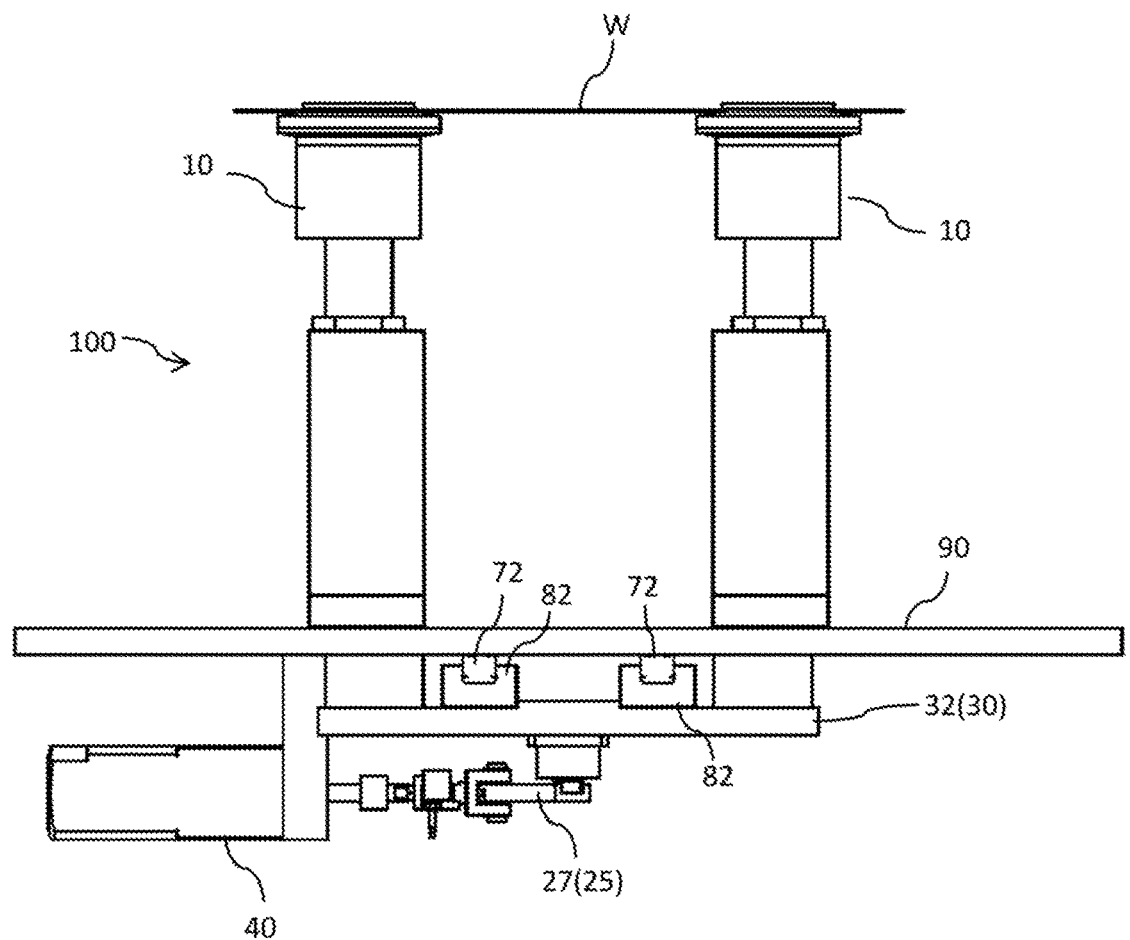
FIG. 3 is a side view of the substrate supporting apparatus that can be used in the first embodiment of the present invention, when seen from a first direction.
Figure 3:
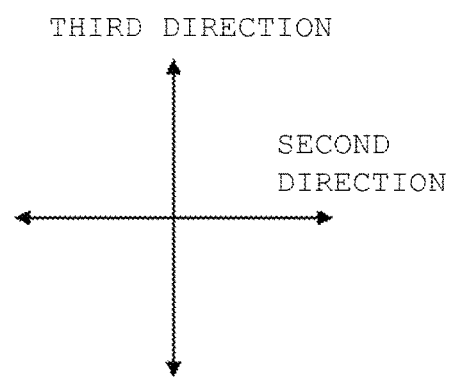
Figure 4:
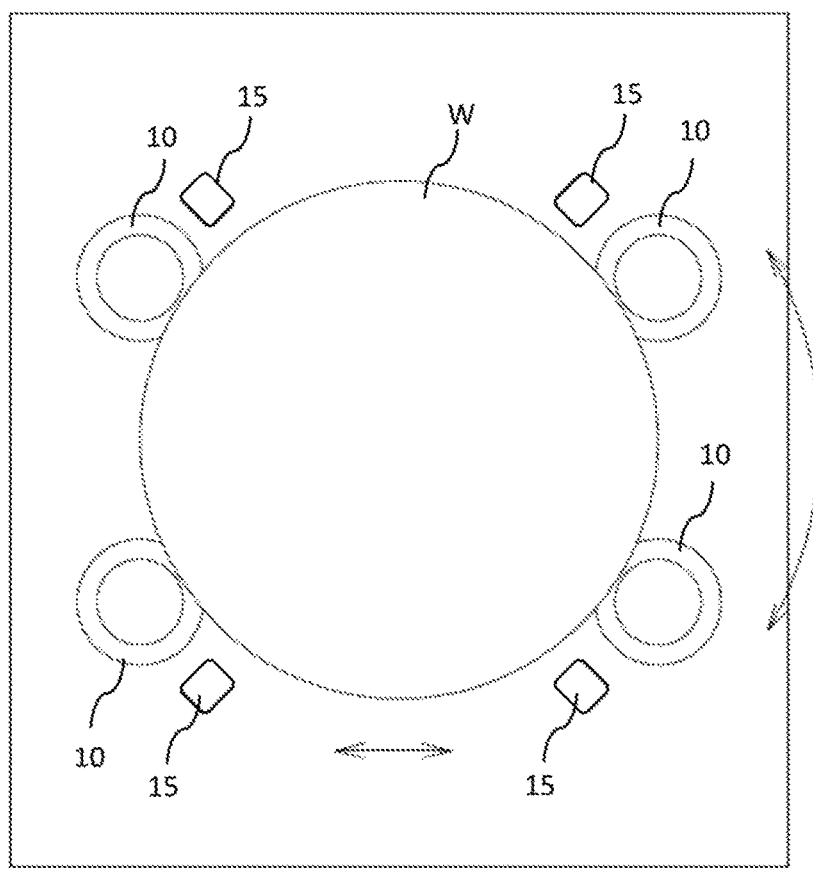
FIG. 4 is a plan view of the substrate supporting apparatus that can be used in the first embodiment of the present invention when seen from above.
Figure 4:
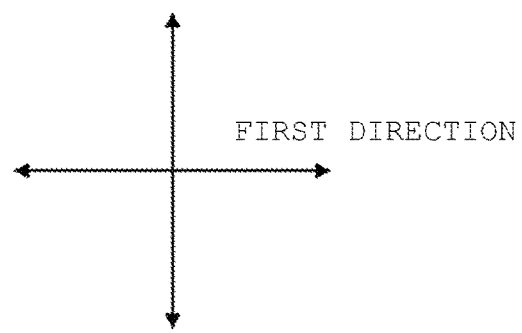

As shown in FIG. 2, the substrate cleaning apparatus according to the present embodiment may have a substrate supporting apparatus 100 formed of a spindle device or the like that supports the substrate W in such a manner that the substrate W can rotate, one or a plurality of cleaning members 200 for cleaning the substrate W, and one or a plurality of cleaning-liquid supplying units 250 that supply cleaning liquid to the substrate W. In the description of the present embodiment, though there will be dealt with an aspect in which the substrate W is supported in such a manner that an in-plane direction of the substrate W is a horizontal direction, the present invention is not limited to that aspect. The in-plane direction of the substrate W may be a vertical direction or a direction inclined with respect to a horizontal direction. Meanwhile, FIG. 2 shows a roll cleaning member as an example of the cleaning member 200.

As shown in FIGS. 1 to 4, the substrate supporting apparatus 100 may have a plurality of supporting members 10 that come into contact with a circumferential part of the substrate W and rotate the substrate W, a pair of driven members 30 in which the plurality of supporting members 10 are provided, a connecting member 20 connecting one driven member 31 and the other driven member 32, and a driving device 40 that moves the connecting member 20 to bring the pair of driven members 30 close to each other, or separate the pair of driven members 30 from each other, along a first direction. The supporting members 10 are members for supporting the substrate W while rotating the substrate W, and for example, are spindles. The pair of driven members 30 may be brought close to each other, or be separated from each other, linearly along the first direction. Though an aspect in which four supporting members 10 are provided will be dealt with in the description of the present embodiment, the present invention is not limited to that. Three or more, or five or more supporting members 10 may be provided. For example, six supporting members 10 may be provided. In the present embodiment, a leftward/rightward direction in FIG. 1 will be referred to as a "first direction", an upward/downward direction in FIG. 1 will be referred to as a "second direction", and a direction normal to the drawing of FIG. 1 (upward/downward direction in FIG. 2) will be referred to as a "third direction". The supporting members 10 in the present embodiment have not only a function of supporting a circumferential part of the substrate W, but also a function of holding or grasping a circumferential part of the substrate W, and function also as a holding unit.

In the present embodiment, two supporting members 10 are provided on the one driven member 31 and the other two supporting members 10 are provided on the other driven member 32. However, the present invention is not limited to that. In an aspect in which six supporting members 10 are provided, for example, three supporting members 10 may be provided on the one driven member 31 and the other three supporting members 10 may be provided on the other driven member 32. A material of the supporting members 10 may be urethane or the like, for example.

A support driving device (not shown) such as a motor that rotates a supporting member 10 provided on the one driven member 31 may be provided in the supporting member 10, and a belt (not shown) may be looped over the supporting member 10 and a different supporting member 10 provided on the one driven member 31. In this case, the supporting member 10 provided with the support driving device serves as a driving end, and the different supporting member 10 having the belt looped thereover, together with the supporting member 10, serves as a driven end. Similarly, a support driving device (not shown) that rotates a supporting member 10 provided on the other driven member 32 may be provided in the supporting member 10, and a belt (not shown) may be looped over the supporting member 10 and a different supporting member 10 provided on the other driven member 32. Also in this case, the supporting member 10 provided with the support driving device serves as a driving end, and the different supporting member 10 having the belt looped thereover, together with the supporting member 10, serves as a driven end.

Figure 1:
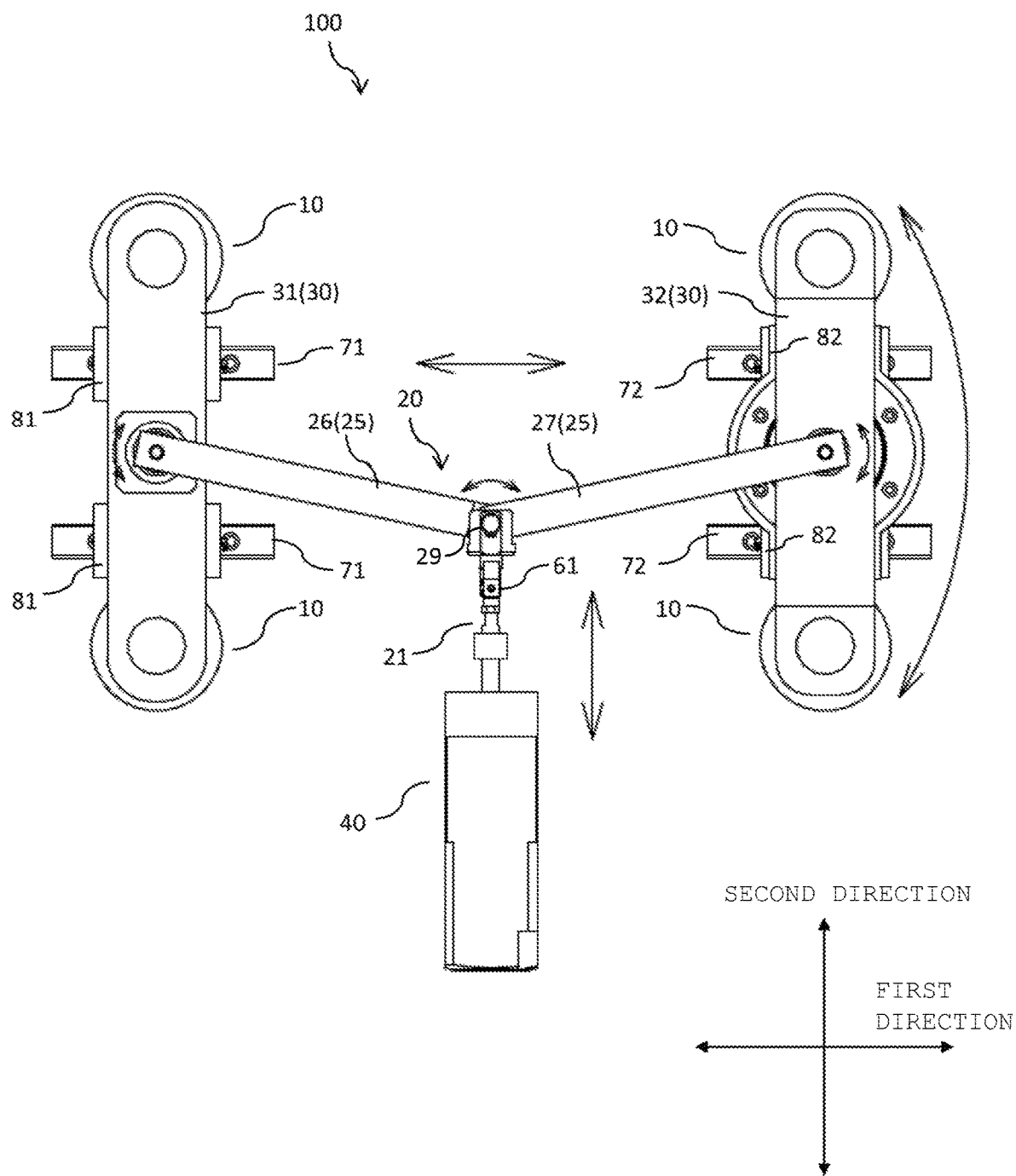
FIG. 1 is a bottom view of a substrate supporting apparatus that can be used in a first embodiment of the present invention, when seen from below.

As shown in FIG. 1, the one driven member 31 may be provided with a first guided member 81 such as a slide core for linearly moving the one driven member 31 along the first direction. The other driven member 32 may be provided with a second guided member 82 such as a slide core for linearly moving the other driven member 32 along the first direction. In a base 90 (refer to FIG. 2), a first guide 71 formed of a rail or the like for guiding the first guided member 81 may be provided. Further, in the base 90, a second guide 72 formed of a rail or the like for guiding the second guided member 82 may be provided.

Figure 5:
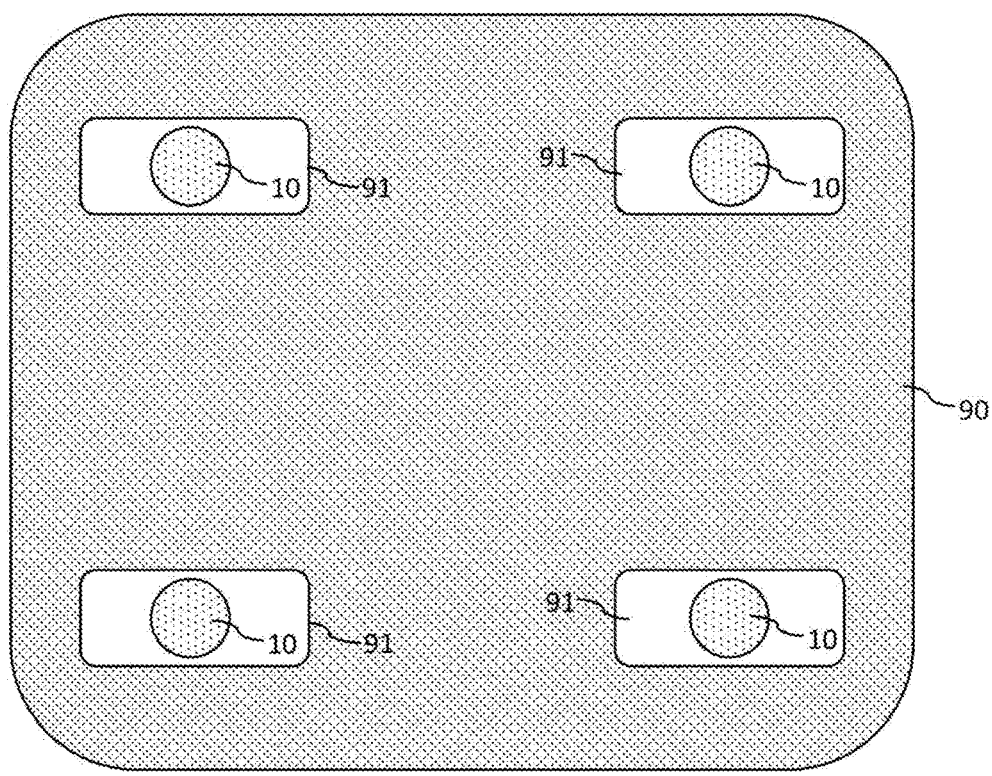
FIG. 5 is a plan view showing relations between long holes and supporting members that can be used in the first embodiment of the present invention.
Figure 5:
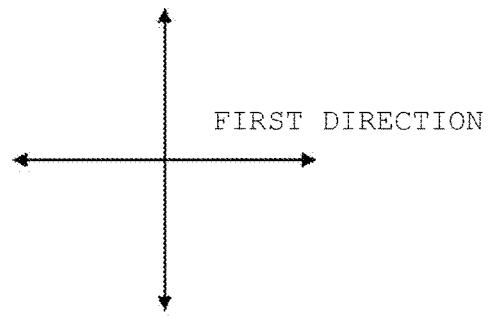

As shown in FIG. 5, each of long holes 91 that extend linearly along the first direction and enable movement of the supporting members 10 may be provided in the base 90. However, the present invention is not limited to this aspect, and holes in any other shapes that can prevent interference between the supporting members 10 and the base 90 may be provided.

Figure 7:
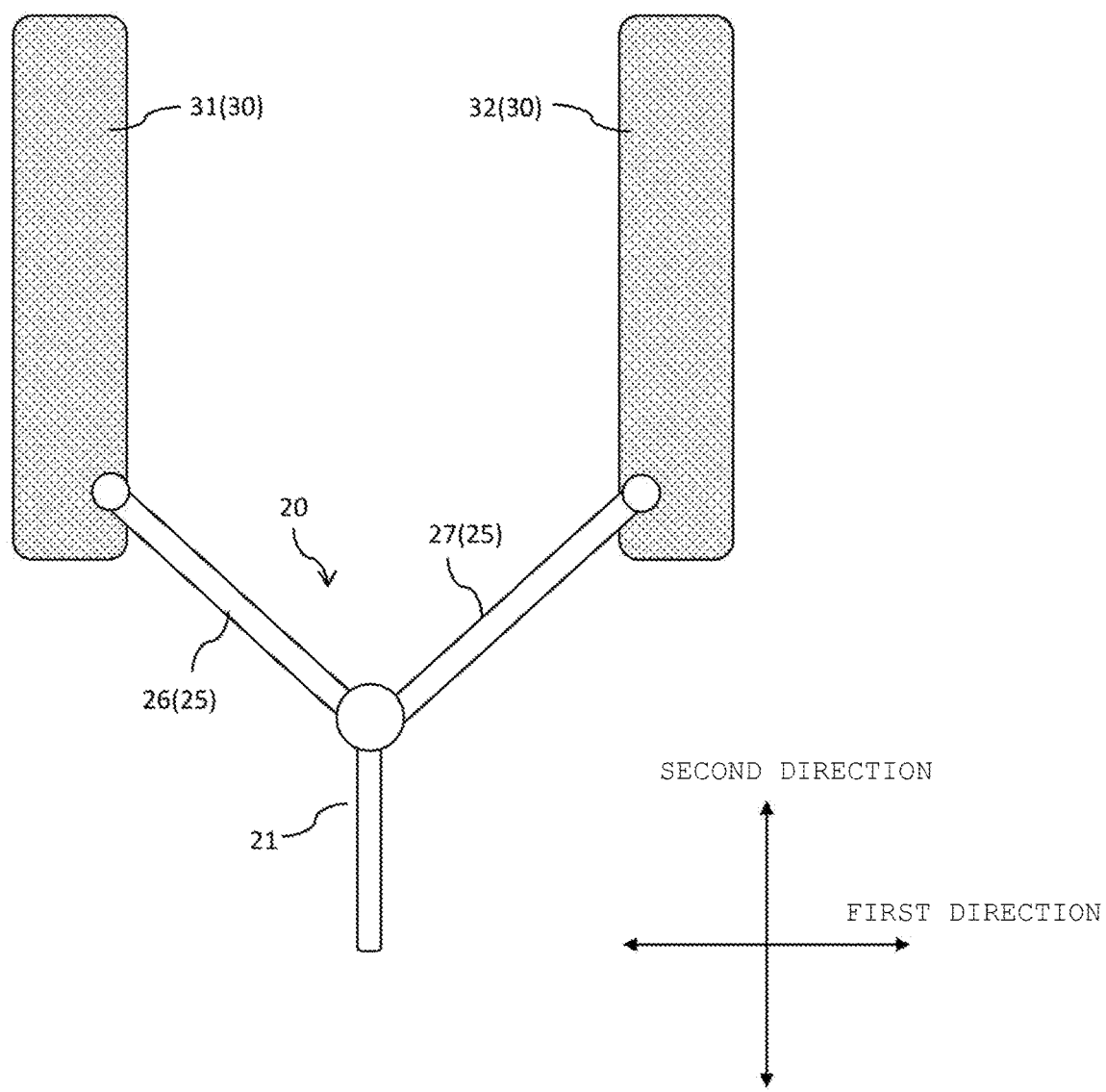
FIG. 7 is a bottom view of the substrate supporting apparatus in another aspect that can be used in the first embodiment of the present invention, when seen from below.

As shown in FIG. 1, one arm 26 may be provided at a lengthwise center of the one driven member 31 and the other arm 27 may be provided at a lengthwise center of the other driven member 32. However, the present invention is not limited to that. Alternatively, as shown in FIG. 7, the one arm 26 may be provided at a lengthwise end of the one driven member 31 and the other arm 27 may be provided at a lengthwise end of the other driven member 32. The lengthwise center of the driven member 31 or 32 means an area that is located in a center if the driven member 31 or 32 is divided into five areas (i.e., an area in the third place). The lengthwise end of the driven member 31 or 32 means an area that is located in an end if the driven member 31 or 32 is divided into five areas (i.e., an area in the first place from the end). Additionally, providing the arms 26 and 27 in the lengthwise centers of the driven members 31 and 32 allows the driven members 31 and 32 to smoothly move linearly along the first direction, which can increase the accuracy of a position where the substrate W is supported by the supporting members 10.

As shown in FIG. 1, the connecting member 20 may have a base end 21 movable linearly along a second direction that is an in-plane direction of the substrate W and is perpendicular to the first direction. A pair of arms 25 may be opened or closed by the linear movement of the base end 21 along the second direction. The connecting member 20 may have a hub 29 connecting the ends of the pair of arms. In addition, the base end 21 may not be provided, and the hub 29 is directly connected with the driving device 40.

A plurality of (two in FIG. 1) first guided members 81 for linearly moving the one driven member 31 along the first direction may be provided on the one driven member 31. A plurality of (two in FIG. 1) second guided members 82 for linearly moving the other driven member 32 along the first direction may be provided on the other driven member 32.

The plurality of first guided members 81 may be provided between the supporting members 10 provided on the one driven member 31 so that the supporting members 10 are provided on opposite sides of the first guided members 81 when seen from the first direction. Further, the plurality of second guided members 82 may be provided between the supporting members 10 provided on the other driven member 32 so that the supporting members 10 are provided on opposite sides of the second guided members 82 when seen from the first direction.

As shown in FIG. 1, the connecting member 20 may have the pair of arms 25 that are opened and closed. The supporting members 10 provided on the one driven member 31 may be swingable (oscillatable) relative to one of the arms (first arm) 26 in an in-plane direction of the substrate W. The supporting members 10 provided on the other driven member 32 may be swingable (oscillatable) relative to the other arm (second arm) 27 in an in-plane direction of the substrate W. In this case, as shown in FIG. 2, for example, the supporting members 10 may be allowed to move along the first direction by a mechanism in a lower region in FIG. 2 and the supporting members 10 may be allowed to swing (oscillate) by a mechanism in an upper region in FIG. 2.

Figure 6:
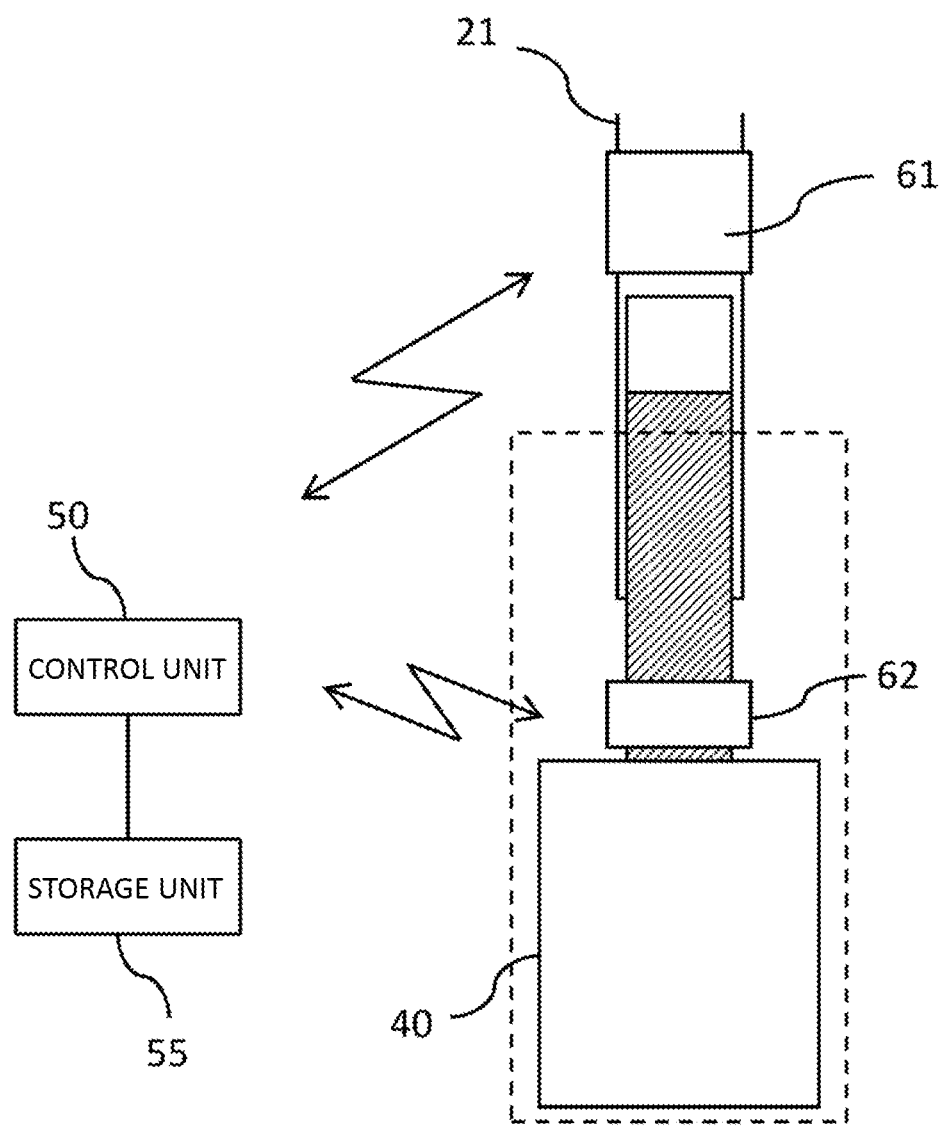
FIG. 6 is a view showing a relation among a first detection device, a second detection device, and a control device that can be used in the first embodiment of the present invention.

As shown in FIG. 6, a first detection device 61 that detects a force to be applied to the connecting member 20 by a driving device 40 may be provided. The first detection device 61 is communicable with a control device 50, and the control device 50 may control the driving device 40 in such a manner that a force detected by the first detection device 61 has a value in a first range. Correlations between forces detected by the first detection device 61 and forces actually applied to the substrate W may be previously measured and stored in a storage unit 55. In this case, a force actually applied to the substrate W can be inferred from a force detected by the first detection device 61 in the control device 50, for example.

The driving device 40 may be a motor. A second detection device 62 that detects the torque of the motor may be provided. The control device 50 may control the motor being the driving device 40 in such a manner that the torque detected by the second detection device 62 has a value in a second range. The driving device 40 may be a cylinder such as an air cylinder. In this case, the second detection device 62 may detect a pressure of gas such as air expelled from the cylinder. Additionally, the first detection device 61 that detects a force applied to the connecting member 20 may be omitted in a case where the second detection device 62 detects the torque of the motor. However, providing the first detection device 61 in addition to the second detection device 62 can reduce the influence by disturbance, to achieve highly-accurate control.

Correlations between information such as torque detected by the second detection device 62 and forces actually applied to the substrate W may be previously measured and stored in the storage unit 55. In this case, a force actually applied to the substrate W can be inferred from the information such as torque detected by the second detection device 62 in the control device 50, for example.

When the driving device 40 moves the base end 21 of the connecting member 20 downward in FIGS. 1 and 7, a distance between the supporting members 10 becomes narrower, so that the substrate W is held by the supporting members 10. Conversely, when the driving device 40 moves the base end 21 of the connecting member 20 upward in FIGS. 1 and 7, a distance between the supporting members 10 becomes wider, so that the substrate W is released from (unclamped by) the supporting members 10.

<<Method>>

An example of a substrate cleaning method using the substrate supporting apparatus 100 according to the present embodiment is as follows. While the following description will be made concise to avoid duplication of the above description, all the aspects in the above description of <<Configuration>> can be applied to the description of <<Method>>. Conversely, all the aspects in the description of <<Method>> can be applied to the description of <<Configuration>>. Further, programs for performing the method according to the present embodiment may be recorded on a recording medium, and the method according to the present embodiment may be performed in a substrate processing apparatus by a computer that reads the programs from the recording medium.

First, the driving device 40 moves the connecting member 20 upward in FIGS. 1 and 7, and thus the pair of driven members 30 are separated linearly along the first direction to be ready to accept the substrate W (the distance between the pair of driven members 30 is increased). Additionally, in a case where the substrate W has already been held by the supporting members 10, when the driving device 40 moves the connecting member 20 upward in FIGS. 1 and 7, the substrate W having been processed can be removed by the conveyance unit 324 or the conveyance robots 326 and 328.

Subsequently, the substrate W to be cleaned next is positioned between the supporting members 10 by the conveyance unit 324 or the conveyance robots 326 and 328.

Then, the driving device 40 moves the connecting member 20 downward in FIGS. 1 and 7 and thus the pair of driven members 30 are brought close to each other linearly along the first direction (the distance between the pair of driven members 30 is decreased), so that a circumferential part of the substrate W is supported (held) by the supporting members 10.

When the substrate W is supported (held) by the supporting members 10 in the above-described manner, the substrate W is rotated by the supporting members 10.

Then, while cleaning liquid is supplied to the surface of the substrate W, the cleaning member 200 such as a roll cleaning member or a pencil cleaning member is pressed against a surface of the substrate W being rotating, so that the surface of the substrate W is cleaned.

When a cleaning process of the substrate W is ended, the driving device 40 moves the connecting member 20 upward in FIGS. 1 and 7 and thus the pair of driven members 30 are separated linearly along the first direction, so that the substrate W having been processed can be removed by the conveyance unit 324 or the conveyance robots 326 and 328.

<<Effects>>

Below, effects that are produced by the present embodiment including the above-described configuration and have not yet been described will be chiefly described. Configurations that are not included in the above description of <<Configuration>>, but will be included in the following description of <<Effects>>, can be adopted in the present invention.

In a case of adopting the aspect in which the connecting member 20 connecting the one driven member 31 and the other driven member 32 is provided and the driving device 40 brings the pair of driven members 30 close to each other or separates the pair of driven members 30 from each other, linearly along the first direction, by moving the connecting member 20, the one driven member 31 and the other driven member 32 can be moved at the same timing. Thus, a position where the substrate W is supported by the supporting members 10 (clamping position) can become unlikely to be displaced.

There may be provided a substrate guide 15 (refer to FIG. 4) for regulating movement of the substrate W in an in-plane direction at the time of conveying the substrate W to circumferential parts of the supporting members 10. Consider a case where the substrate guide 15 is employed in such an aspect as in the conventional art in which two supporting members on one side are fixed so as not to move in an in-plane direction of the substrate W, thereby forming a fixed-side clamping mechanism whereas two supporting members on the other side are movable in an in-plane direction of the substrate W, thereby forming a driving-side clamping mechanism. In this case, as the supporting members wear out, the substrate rotates in a position where the substrate comes into contact with the substrate guide 15. This may possibly cause the substrate guide 15 to wear out. In contrast thereto, by the use of the aspect of the present embodiment, the substrate guide 15 can be prevented from wearing out because a position where the substrate W is held does not significantly change in spite of wear-out of the supporting members 10. Additionally, providing the above-described substrate guide 15 can prevent the substrate W having been subjected to processes such as cleaning from being engaged in the supporting members 10 and then moving together with the supporting members 10 in an in-plane direction.

It is conceivable that the substrate W is clamped by the supporting members 10 through rotational movement (swing) of both of the one driven member 31 and the other driven member 32 connected by the connecting member 20 at the same timing. However, in this case, a distance by which each of the supporting members 10 travels to the substrate W is shorter than a traveling distance of the connecting member 20, which may increase a difference in timing at which the supporting members 10 come into contact with a circumferential part of the substrate W if the supporting members 10 wear out. Further, under the influence of friction on a rotation axis (axis for swing), a difference in timing at which the supporting members 10 come into contact with a circumferential part of the substrate W may be increased. In contrast thereto, the one driven member 31 and the other driven member 32 are caused to linearly move as described above, so that a traveling distance of each of the supporting members 10 can be longer than a traveling distance of the connecting member 20. This can reduce a difference in timing at which the supporting members 10 come into contact with a circumferential part of the substrate W in spite of possible wear-out of the supporting members 10. Further, as the one driven member 31 and the other driven member 32 linearly move, there are exerted little influence of friction between members, such as friction between a guided member and a guiding member. As a result, a supporting position of the substrate W can be prevented from being displaced, which can enhance an efficiency in cleaning the substrate W.

Further, by adoption of such an aspect as in the present embodiment in which all of the supporting members 10 linearly move along the same first direction, respective timings at which the supporting members 10 come into contact with a circumferential part of the substrate W can be accurately matched because all of the supporting members 10 performs the same and simple linearly movement. This can prevent a supporting position of the substrate W from being displaced.

A distance by which each of the one driven member 31 and the other driven member 32 moves linearly along the first direction may be 5 mm or shorter, and may be in a range from 2 mm to 3 mm. In a case of adopting this aspect, a traveling distance that is approximately 10 mm in the aspect according to the conventional art having the fixed-side clamping mechanism and the driving-side clamping mechanism can be reduced to such a short traveling distance as mentioned above. Such a short traveling distance allows the substrate W to be maintained on top surfaces of the supporting members 10 even if the supporting members 10 move. Further, without the above-described substrate guide 15, such a short traveling distance can prevent the substrate W having been subjected to processes such as cleaning from falling from the top surfaces of the supporting members 10. Additionally, employing a motor as the driving device 40 can more certainly achieve such a short traveling distance. This is because using a motor, unlike a cylinder such as an air cylinder that typically moves along distance, can easily achieve a short traveling distance.

There may be adopted an aspect in which a traveling distance of the one driven member 31 and a traveling distance of the other driven member 32 are substantially the same or the same. In this case, respective timings at which the one driven member 31 and the other driven member 32 come into contact with a circumferential part of the substrate W can be matched more exactly, so that a position where the substrate W is supported by the supporting members 10 can become unlikely to be displaced. Additionally, the terms "the distances traveled are substantially the same" mean that a difference between a distance L1 traveled by the one driven member 31 in linear movement along the first direction and a distance L2 traveled by the other driven member 32 in linear movement along the first direction is within 5% of either the distance L1 or the distance L2, whichever is long. Thus, the terms mean that L1−L2≤0.05×L1 when L1≥L2 and that L2−L1≤0.05×L2 when L1<L2.

In a case where the first guided member 81 for linearly moving the one driven member 31 along the first direction is provided on the one driven member 31 and the second guided member 82 for linearly moving the other driven member 32 along the first direction is provided on the other driven member 32, linear movement along the first direction can be achieved with a simple configuration.

As shown in FIG. 5, in a case of adopting the aspect in which each of the long holes 91 that extend along the first direction and enable movement of the supporting members 10 is provided in the base 90, the supporting members 10 can be moved along the long holes 91 and the first direction. A clearance may be left along the second direction between each supporting member 10 and the base 90 in the corresponding long hole 91 so that the supporting members 10 and the base 90 are prevented from coming into contact with each other along the second direction. In a case of adopting this aspect, no friction force is generated in the clearance along the second direction between the supporting members 10 and the base 90. Thus, the supporting members 10 can be prevented from coming into contact with a circumferential part of the substrate W at different timings under the influence of friction between the supporting members 10 and the base 90. Further, the use of the long holes 91 can minimize areas of holes to be provided in the base 90.

In a case of adopting the aspect in which the plurality of first guided members 81 are provided between the supporting members 10 provided on the one driven member 31 and the plurality of second guided members 82 are provided between the supporting members 10 provided on the other driven member 32, the plurality of guides 71 and 72 and the plurality of guided members 81 and 82 allow the one driven member 31 and the other driven member 32 to move along the first direction more certainly without increasing the dimension along the second direction. That is, it is conceivable to provide the supporting members 10 between the plurality of guides 71 or 72. In this case, however, the dimension along the second direction is increased. In contrast, adopting the present aspect can prevent increase of the dimension along the second direction. Further, providing the plurality of guides 71 and 72 and the plurality of guided members 81 and 82 more certainly enables linear movement along the first direction, as compared to the aspect in which the guide 71, the guide 72, the guided member 81, and the guided member 82 are each provided singly.

In a case of adopting the aspect in which the pair of arms 25 are opened and closed by linear movement of the base end 21 of the connecting member 20 along the second direction perpendicular to the first direction, the one arm 26 and the other arm 27 can be opened and closed at the same timing by a simple driving system of linearly moving the base end 21.

In a case where the first detection device 61 that detects a force applied to the connecting member 20 by the driving device 40 is provided, a force with which the supporting members 10 support the substrate W (clamping force) can be detected through detection of a force applied to the connecting member 20 by the driving device 40. Further, by adoption of the aspect in which the control device 50 controls the driving device 40 in such a manner that a force detected by the first detection device 61 has a value in the first range, a force of the supporting members 10 for supporting the substrate W can have a value in a desired range at all times.

In a case of adopting the aspect in which the plurality of supporting members 10 provided on the one driven member 31 are swingable relative to the one arm 26 in an in-plane direction of the substrate W (oscillating mechanism), each of the supporting members 10 provided on the one driven member 31 is allowed to come into contact with a circumferential part of the substrate W. Further, in a case of adopting the aspect in which the plurality of supporting members 10 provided on the other driven member 32 are swingable relative to the other arm 27 in an in-plane direction of the substrate W (oscillating mechanism), each of the supporting members 10 provided on the other driven member 32 is allowed to come into contact with a circumferential part of the substrate W. Thus, in the aspect in which four or more supporting members 10 are provided, a circumferential part of the substrate W can be supported by the four or more supporting members 10. Additionally, the above-described oscillating mechanism may be provided in either the one driven member 31 or the other driven member 32. In this regard, providing the oscillating mechanism in each of the one driven member 31 and the other driven member 32 is useful in that the supporting members 10 can more accurately follow the substrate W having a shape of an imperfect circle.

In a case of adopting the aspect in which the driving device 40 is formed of a motor, the second detection device 62 detects the torque of the motor, and the control device 50 controls the motor in such a manner that the torque detected by the second detection device 62 has a value in the second range, a force of the supporting members 10 for supporting the substrate W can have a value in a desired range at all times. Because of high resolution and high controlling performance of the motor, employing the motor allows highly-accurate control over movement of the driven member 30. Thus, respective timings at which the supporting members 10 come into contact with a circumferential part of the substrate W can be matched with high accuracy, and a force of the supporting members 10 for supporting (grasping) the substrate W can be controlled with high accuracy.

As already described, the use of both of the first detection device 61 and the second detection device 62 can reduce the influence by disturbance. In a case where the driving device 40 is formed of the motor, primary detection and secondary detailed detection may be performed by the first detection device 61 and the second detection device 62, respectively. In this case, the control device 50 may activate the second detection device 62 and exercise control to keep the tongue of the motor detected by the second detection device 62 within a certain range after the first detection device 61 confirms that a force applied to the connecting member 20 by the driving device 40 is within a certain range.

Second Embodiment

Next, a second embodiment of the present invention will be described.

Figure 9:
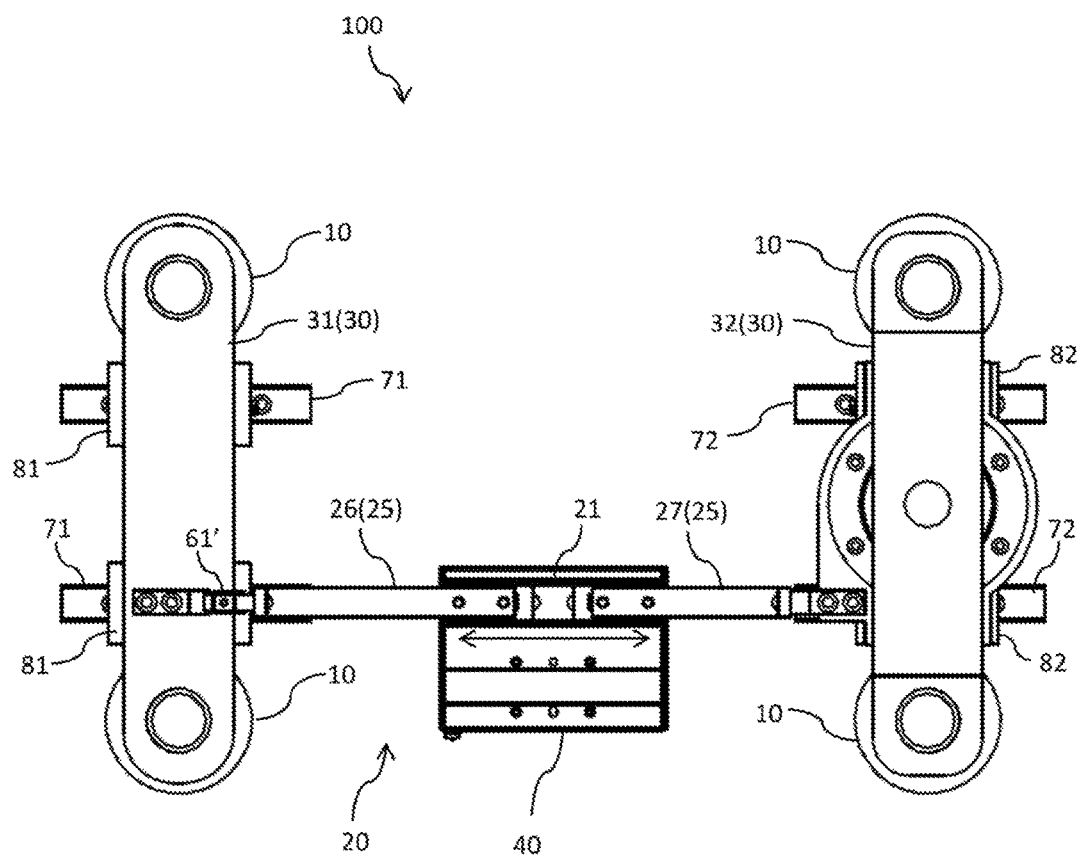
FIG. 9 is a bottom view of a substrate supporting apparatus that can be used in a second embodiment of the present invention, when seen from below.
Figure 9:
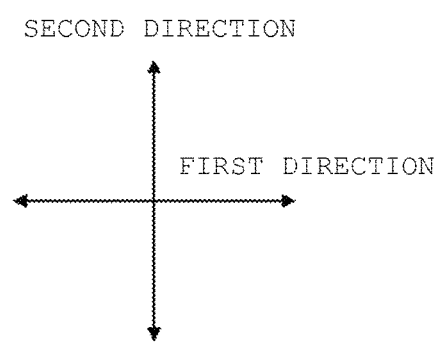

In the present embodiment, as shown in FIG. 9, one arm 26 and the other arm 27 are linearly connected via a base end 21 in which the driving device 40 is provided. Then, when the driving device 40 causes the one arm 26 and the other arm 27 forming a part of a connecting member 20 to linearly move along the first direction, a pair of driven members 31 and 32 can be brought close to, or separated from, each other, linearly along the first direction simultaneously. Further, there may be provided a configuration in which one driven member 31 and the other driven member 32 simultaneously move the same distance or substantially the same distance. The configuration is similar to that in the first embodiment in the other respects, and the various aspects described in the first embodiment can be adopted. The components described in the first embodiment will be described by using the same reference signs. The base end 21 in the present embodiment may be formed of a gripper or the like that grasps the one arm 26 and the other arm 27.

In a case of adopting the aspect in which the driving device 40 causes the one arm 26 and the other arm 27 forming a part of the connecting member 20 to simultaneously move the same distance or substantially the same distance, thereby bringing the pair of driven members 30 close to each other or separating the pair of driven members 30 from each other, linearly along the first direction, the one driven member 31 and the other driven member 32 can be caused to move the same distance or substantially the same distance at the same timing. Thus, a position where the substrate W is supported by the supporting members 10 (clamping position) can become unlikely to be displaced.

Figure 10:
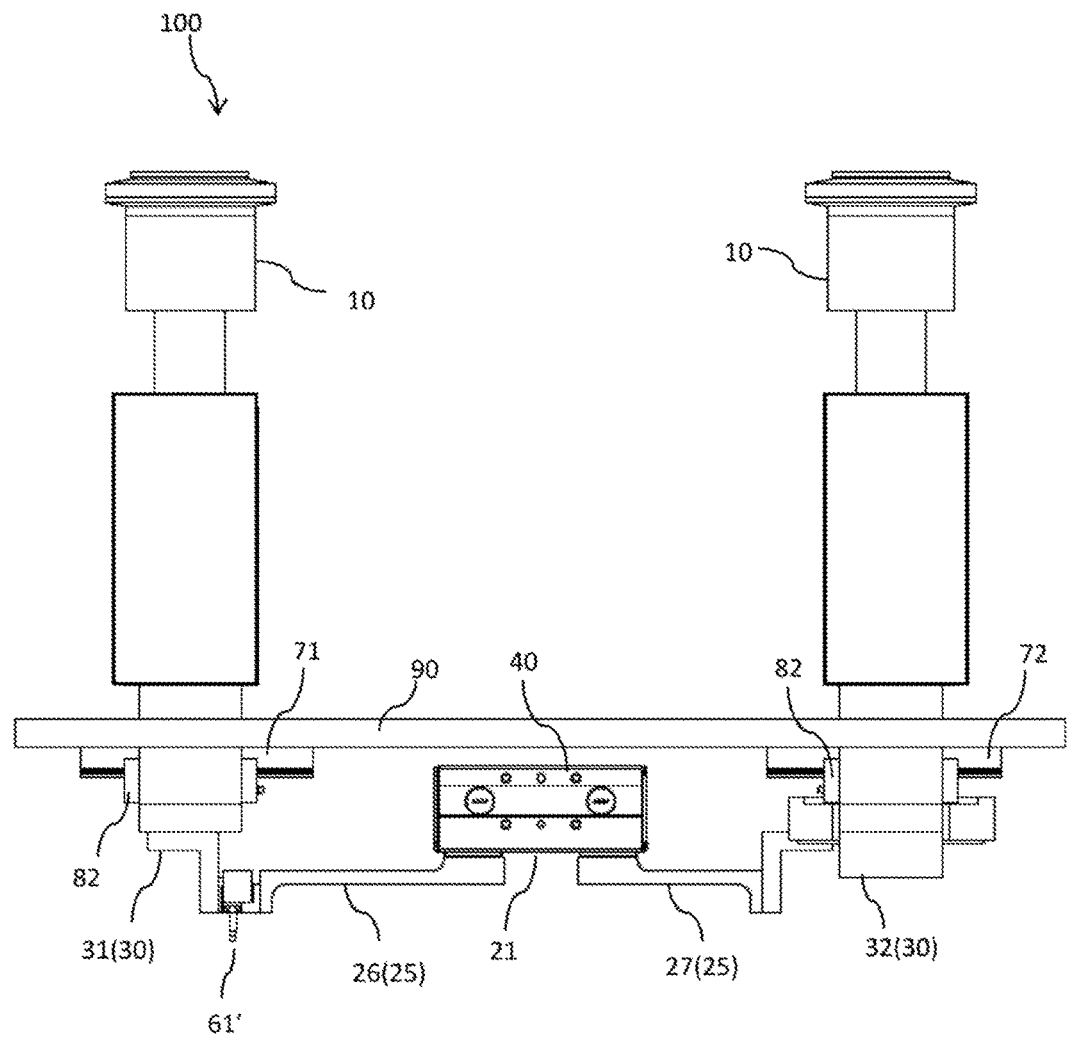
FIG. 10 is a side view of the substrate supporting apparatus that can be used in the second embodiment of the present invention, when seen from a second direction.

As shown in FIGS. 9 and 10, there may be provided a first detection device 61' that detects a force applied to the one driven member 31 and/or the other driven member 32 by the driving device 40 via the one arm 26 and/or the other arm 27 of the connecting member 20. Additionally, though FIGS. 9 and 10 show an aspect in which the first detection device 61' is provided between the one arm 26 and the one driven member 31, the present invention is not limited to that aspect. The first detection devices 61' may be provided both between the one arm 26 and the one driven member 31 and between the other arm 27 and the other driven member 32.

In the aspect shown in FIGS. 9 and 10, the one arm 26 and the other arm 27, as well as a first guide 71 and a second guide 72, are provided so as to linearly extend along the first direction. In other words, when seen from a third direction, all of the one arm 26, the other arm 27, the first guide 71, and the second guide 72 are arranged on the same straight line along the first direction. Thus, when the one arm 26 and the other arm 27 are moved, a first guided member 81, which is guided by the first guide 71, can be efficiently moved linearly along the first direction, and a second guided member 82, which is guided by the second guide 72, can be efficiently moved linearly along the first direction.

The description of each embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings and so on. The substrate supporting apparatus 100 according to the present embodiments can be employed in various modules such as an IPA module, a PEN module, a two-fluid jet module. Meanwhile, a bevel cleaning apparatus and a rotation detecting mechanism for the substrate W may be provided in conjunction with the substrate supporting apparatus.

The foregoing description discloses only example embodiments of the invention. Modifications of the above-disclosed apparatus and methods which fall within the scope of the invention will be readily apparent to those of ordinary skill in the art. Accordingly, while the present invention has been disclosed in connection with example embodiments thereof, it should be understood that other embodiments may fall within the scope of the invention, as defined by the following claims.

REFERENCE SIGNS LIST 10 supporting member
20 connecting member
21 base end
25 pair of arms
30 driven member
31 one driven member
32 the other driven member
40 driving device
50 control device
61 first detection device
62 second detection device
81 first guided member
82 second guided member
91 long hole
W substrate

The invention claimed is:
1. A substrate supporting apparatus comprising:
 a plurality of supporting members adapted to contact a circumferential part of a substrate and rotate the substrate;
 a pair of driven members on which the plurality of supporting members are provided;

a connecting member which is movably coupled to a first driven member of the pair of driven members and which is movably coupled to a second driven member of the pair of driven members;

a driving device adapted to transmit a force for the connecting member to move linearly along a second direction, a first guided member, which is provided on the first driven member, for linearly moving the first driven member along a first direction;

a second guided member, which is provided on the second driven member, for linearly moving the second driven member along the first direction;

a first guide for guiding the first guided member along the first direction;

a second guide for guiding the second guided member along the first direction; and a base on which the first guide and the second guide are provided, wherein:

holes extending along the first direction are provided in the base, through which the plurality of supporting members pass, wherein the connecting member is adapted to convert the force along the second direction to a force to increase or decrease a distance between the pair of driven members.

2. The substrate supporting apparatus according to claim 1, wherein:

the connecting member has a base end movable along the second direction that is parallel to an in-plane direction of the substrate and is perpendicular to the first direction, and has a pair of arms, and the pair of arms are opened or closed by moving the base end along the second direction.

3. The substrate supporting apparatus according to claim 1, further comprising:

a first detection device that detects a force applied to the connecting member by the driving device or a force applied to the pair of driven members via the connecting member by the driving device; and a control device configured to control the driving device such that the force detected by the first detection device has a value in a first range.

4. The substrate supporting apparatus according to claim 1, wherein;

the driving device is a motor, the substrate supporting apparatus further comprising:

a second detection device that detects torque of the motor; and a control device configured to control the motor such that the torque detected by the second detection device has a value in a second range.

5. The substrate supporting apparatus according to claim 1, wherein a part of the connecting member is extending in the second direction, and the connecting member has a pair of arms and a hub connecting the pair of arms, wherein the hub is moved along the second direction to increase or decrease the distance between the pair of driven members.

* * * * *